(12) United States Patent  
Kashino

(10) Patent No.: US 7,049,154 B2  
(45) Date of Patent: May 23, 2006

(54) VAPOR PHASE GROWTH METHOD BY CONTROLLING THE HEAT OUTPUT IN THE GAS INTRODUCTION REGION

(75) Inventor: Hisashi Kashino, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/481,333

(22) PCT Filed: Jun. 20, 2002

(86) PCT No.: PCT/JP02/06155

§ 371 (c)(1),  
(2), (4) Date: Dec. 22, 2003

(87) PCT Pub. No.: WO03/003432

PCT Pub. Date: Jan. 9, 2003

(65) Prior Publication Data

US 2004/0157446 A1    Aug. 12, 2004

(30) Foreign Application Priority Data

Jun. 28, 2001    (JP) ............................. 2001-196768

(51) Int. Cl.  
*H01L 21/00* (2006.01)

(52) U.S. Cl. ..................... 438/5; 438/900; 438/908; 438/909; 438/913; 118/715; 118/719

(58) Field of Classification Search .................. 438/5, 438/900, 908, 909, 913; 118/715, 719  
See application file for complete search history.

(56) References Cited

U.S. PATENT DOCUMENTS

| 5,525,160 A | * | 6/1996 | Tanaka et al. | 118/728 |
| 6,454,860 B1 | * | 9/2002 | Metzner et al. | 118/715 |
| 6,475,627 B1 | * | 11/2002 | Ose | 428/446 |

FOREIGN PATENT DOCUMENTS

| JP | A 5-62907 | 3/1993 |
| JP | A 9-7953 | 1/1997 |
| JP | A 2001-77032 | 3/2001 |
| JP | A 2001-156011 | 6/2001 |

* cited by examiner

*Primary Examiner*—George Fourson  
*Assistant Examiner*—Thanh V. Pham  
(74) *Attorney, Agent, or Firm*—Oliff & Berridge, PLC

(57) ABSTRACT

A vapor phase growth method for growing a semiconductor single crystal thin film on a front surface of a semiconductor single crystal substrate (1) while introducing gas into a reaction chamber (11), has a step of performing heating output power control in a gas introduction region (R1) according to a temperature detected in a region other than the gas introduction region (R1) in the reaction chamber (11).

7 Claims, 7 Drawing Sheets

— CENTER
······ EXHAUST REGION
—·— INTRODUCTION REGION

RELATED ART

VAPOR PHASE GROWTH METHOD BY CONTROLLING THE HEAT OUTPUT IN THE GAS INTRODUCTION REGION

TECHNICAL FIELD

This invention relates to a vapor phase growth method and a vapor phase growth apparatus in which a semiconductor single crystal thin film grows on a front surface of a semiconductor single crystal substrate while introducing gas into a reaction chamber.

BACKGROUND ART

As shown in FIG. 5, for example, in a single wafer processing type vapor phase growth apparatus 100 of a prior art, a semiconductor single crystal substrate (hereinafter, sometimes referred simply as a substrate) 1 is mounted on a susceptor 112 arranged in a reaction chamber, the substrate 1 is rotated almost horizontally with the susceptor 112, gas is introduced into the reaction chamber 102 from one side (for example, the left side in FIG. 5) along a direction of an arrow A and is exhausted to other side opposite to the introduction side along a direction of an arrow B, the substrate 1 is heated to a desired temperature setting by using a heating apparatus (not shown) installed outside of the reaction chamber 102, and a semiconductor single crystal thin film (hereinafter, sometimes referred simply as a thin film) is grown by a vapor phase growth method on a front surface of the substrate 1.

Because conditions such as temperature (especially the temperature of the substrate 1), temperature distribution (especially the temperature distribution within the surface of the substrate 1) and the like influence properties of the thin film during the vapor phase growth, proper control of these conditions are essential.

Control of the temperature and the temperature distribution is performed, for example, by feeding back detected temperatures of a substrate 1 (for example, heated by halogen lamps) by thermocouples to a heat output of the heating apparatus and by heating the substrate 1 so as to make the detected temperatures of the substrate 1 approach to setting temperatures.

The thermocouples are respectively located in a plurality of regions of the reaction chamber such as a central region of the substrate, a side surface region, a gas introduction region and a gas exhaust region and the like. Temperature of each region is detected by the corresponding thermocouple, and the temperatures of the regions are independently controlled according to the detected temperatures by using, for example, the halogen lamps.

The thermocouples are installed in a heat retaining plate 115 arranged so as to surround the susceptor 112. In detail, thermocouples 101a, 101b, 101c and 101d are installed in the heat retaining plate 115 so as to place, for example, one thermocouple 101d at the position corresponding to the center of the substrate 1 and place three thermocouples 101a (the side surface region of the reaction chamber), 101b (the gas exhaust region) and 101c (the gas introduction region) at the peripheral positions of the substrate 1, and temperature at each position is detected.

Temperature change with the passage of time, which is detected by the thermocouple located at each of the positions of the reaction chamber 102 (the center of the substrate, the gas introduction region and the gas exhaust region), is shown in FIG. 6. As shown in FIG. 6, the temperature detected in a gas introduction region R100 (shaded area in FIG. 5) by the thermocouple 101c is higher than the temperatures detected in both the center of the substrate 1 and the gas exhaust region by the thermocouple 101d and the thermocouple 101b respectively.

The gas introduction region R100 in the reaction chamber 102 is cooled down due to the gas introduced at almost room temperature. Therefore, assuming that the output power for heating is uniformly set in the whole area in the reaction chamber 102, the periphery temperature of the substrate at the gas introduction region becomes low as compared with temperatures in the other area of the substrate 1. As a result, slip dislocation undesirably and easily occurs.

Accordingly, to prevent the slip dislocation occurring due to the reason described above, temperature setting in the gas introduction region R100 is relatively heightened. Therefore, as described above, temperature detected in the gas introduction region R100 becomes higher than those detected at the center of the substrate and the gas exhaust region.

Incidence of the slip dislocation depends on temperature setting difference between two points on a surface of a substrate 1 (unit of ° C.), that is, an offset level of the temperature setting. Therefore, it is preferable to set the offset level so as to lower the incidence of the slip dislocation as possible.

On the other hand, resistivity distribution in a growing thin film changes in accordance with the offset level of the temperature setting. FIG. 4 is a graph showing a correlation between the offset level of the temperature setting (X-axis) and the resistivity distribution (Y-axis; resistivity difference between the center and a periphery of the substrate) of the thin film.

This graph is obtained by changing the offset level of the temperature setting at the gas exhaust region against that at the center of the substrate and by growing a silicon single crystal thin film having a thickness of about 7 μm and a resistivity of about 10 Ω·cm by a vapor phase growth method at a temperature of 1110° C. on a front surface of a p$^+$-type silicon single crystal substrate to which boron is added at high concentration.

The X-axis indicates differences between setting temperatures of heating for the center of the substrate and setting temperatures of heating for the gas exhaust region, during thin film formation. Temperature at the center of the substrate is detected by the thermocouple 101d, and temperature in the gas exhaust region is detected by the thermocouple 101b. The Y-axis indicates a value (unit of Ω·cm) obtained by subtracting an average of resistivity values at four peripheral positions from a resistivity value at the center of the thin film in a grown silicon single crystal thin film. As the value of the Y-axis approaches to zero, uniformity of in-plane resistivity distribution is heightened.

A range of the offset level in which no slip dislocation occurred in the growth conditions described above is shown in FIG. 4 as a range H100. That is, when the offset level is within a range of −60° C. to −70° C., slip dislocation scarcely occurs. However, slip dislocation easily occurs in out of this range H100.

According to FIG. 4, to make in-plane resistivity distribution be substantially 0 (zero), setting the offset level to be −95° C., that is, setting the temperature at the gas exhaust region lower than the temperature at the center of the substrate by 95° C. is required. However, when the temperature setting difference between the gas exhaust region and the center of the substrate is so large as described above, the offset level becomes out of the range H100, and slip dislocation occurs easily.

Contrarily, to make slip dislocation scarcely occur, because the least offset value is −70° C. (within the range H100), when a silicon single crystal thin film with resistivity of about 10 Ω·cm is grown by a vapor phase growth method, lowest resistivity difference between the center and a periphery in the thin film can be at most 0.7 Ω·cm or so.

Each detected temperature denotes a temperature detected by a thermocouple and is slightly different from actual temperature of the substrate 1.

In order to solve the above problem, an object of the present invention is to provide a vapor phase growth method and a vapor phase growth apparatus which can improve in-plane resistivity distribution while suppressing occurrence of slip dislocation.

DISCLOSURE OF THE INVENTION

When an inside of a reaction chamber is heated while supplying atmosphere gas into the reaction chamber or while supplying a source gas into the reaction chamber, a gas introduction region in the reaction chamber is easily cooled down by the gas introduced at almost room temperature. Therefore, it is required to lower temperature distribution in a substrate by heating the gas introduction region of the reaction chamber stronger than the center and a side surface region of the substrate and a gas exhaust region in the reaction chamber.

However, during the heating, when temperatures are detected at each of the center and the side surface region of the substrate, the gas introduction region and the gas exhaust region in the reaction chamber, and heat control is performed for each region according to the detected temperature independently, because a degree of heating for each region changes occasionally, an offset value sometimes instantly deviates from a preset offset value.

That is, for example, even though an offset of +30° C. is set for the gas introduction region, where the temperature is easily changed, against the center of the substrate, that is, even though the setting temperature at the gas introduction region is set to be higher than the setting temperature at the center of the substrate by 30° C., because heating for the gas introduction region is controlled independently from heating for the center of the substrate, the temperature difference is sometimes instantly lowered to about −10° C. and is contrarily heightened to about +50° C.

In accordance with a first aspect of the present invention, a vapor phase growth method for growing a semiconductor single crystal thin film on a front surface of a semiconductor single crystal substrate while introducing gas into a reaction chamber, comprises a step of performing heating output power control in a gas introduction region according to a temperature detected in a region other than the gas introduction region in the reaction chamber. The vapor phase growth method of the present invention is especially effective when the vapor phase growth is performed by using a single wafer processing type vapor phase growth apparatus.

Preferably, heating output power control in the gas introduction region is performed according to a temperature detected at a gas exhaust region or a position corresponding to a center of the semiconductor single crystal substrate in the reaction chamber.

Preferably, a temperature setting of the gas exhaust region against a center of the semiconductor single crystal substrate is set so as to minimize resistivity distribution of the semiconductor single crystal thin film within a range corresponding to no occurrence of slip dislocation.

In accordance with a second aspect of the present invention, a vapor phase growth apparatus comprises a reaction chamber configured to be able to introduce gas for growing a semiconductor single crystal thin film by a vapor phase growth method on a front surface of a semiconductor single crystal substrate arranged therein; a heating apparatus for heating an inside of the reaction chamber; a detector for detecting a temperature of a region other than a gas introduction region in the reaction chamber; and a heating output power control apparatus for controlling the heating apparatus according to the temperature detected by the detector to perform heating output power control of the gas introduction region.

In the vapor phase growth method and apparatus according to the present invention, heating output power control of the gas introduction region, where the temperature is easily changed, is performed according to a temperature detected in a temperature stable region (hereinafter, referred as a standard region) other than the gas introduction region in the reaction chamber, for example, a temperature detected at the gas exhaust region or at a position corresponding to the center of the substrate. Accordingly, the heating can be performed while keeping a heating output power ratio between the standard region and the gas introduction region to a constant level.

Particularly, because temperature distribution within the surface of the substrate can be suppressed during heating up, slip dislocation scarcely occurs, and offset temperature range corresponding to no occurrence of slip dislocation becomes wider. In other words, temperature range possible to perform temperature adjustment for improvement of in-plane resistivity distribution becomes wider while satisfying conditions for being able to suppress occurrence of slip dislocation. Accordingly, in the vapor phase growth method and the apparatus according to the present invention, the in-plane resistivity distribution can be improved while suppressing occurrence of slip dislocation.

In the vapor phase growth method according to the present invention, preferably, heating output power control in the reaction chamber is performed according to temperatures detected only at two positions corresponding to the center of the semiconductor single crystal substrate in the reaction chamber and the gas exhaust region in the reaction chamber. Heating output power control is, for example, performed according to temperatures detected by thermocouples.

In accordance with a third aspect of the present invention, a vapor phase growth apparatus comprises a reaction chamber configured to be able to introduce gas for growing a semiconductor single crystal thin film by a vapor phase growth method on a front surface of a semiconductor single crystal substrate arranged therein; a heating apparatus for heating an inside of the reaction chamber; a first detector for detecting a temperature of a gas exhaust region in the reaction chamber; a second detector for detecting a temperature of a position corresponding to a center of the semiconductor single crystal substrate in the reaction chamber; and a heating output power control apparatus for controlling the heating apparatus according to the temperatures detected by the first and second detectors to perform heating output power control in the reaction chamber. Each detector is, for example, a thermocouple.

In this case, because heating output power control in the reaction chamber is performed according to the temperatures detected only at two positions corresponding to the center of the semiconductor single crystal substrate in the reaction chamber and the gas exhaust region in the reaction chamber, a period of time required to determine conditions for a vapor phase growth can be shortened as compared with the case in that heating output power control is performed according to temperatures detected at three positions or more. Accordingly, productivity can be extremely improved.

Further, because detectors such as thermocouples, for example, arranged only at two positions corresponding to the center of the semiconductor single crystal substrate in the reaction chamber and the gas exhaust region in the reaction chamber are required (only two detectors are required), cost of configuring the vapor phase growth apparatus and cost of maintaining the vapor phase growth apparatus can be lowered as compared with that for a case where three detectors or more are required. Moreover, a down time of the vapor phase growth apparatus required for replacing consumed detectors can be shortened, and a time for temperature profiling required when the detector is replaced can be shortened as compared with a case where three detectors or more are required. Time for the temperature profiling is lengthened as the number of detectors is increased.

BEST MODE FOR CARRYING OUT THE INVENTION

Hereinafter, an embodiment of the present invention will be explained with reference to drawings.

Figure 1:
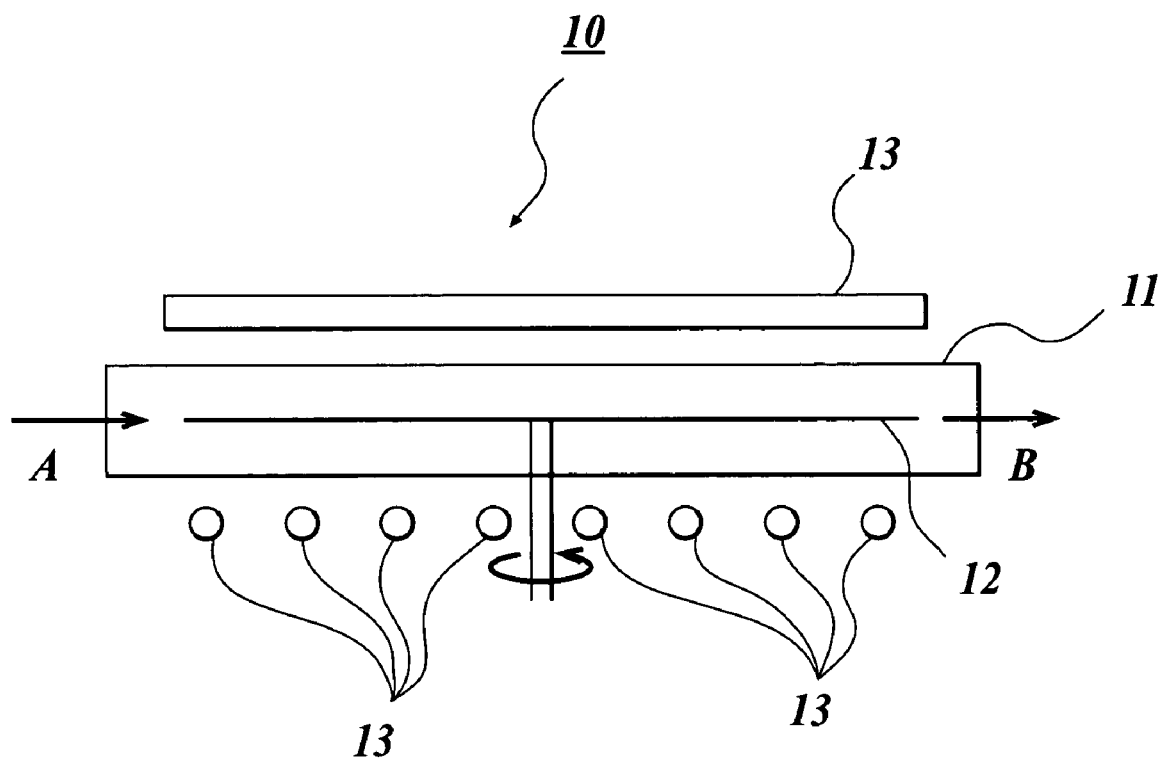
FIG. 1 is a sectional side view schematically showing a single wafer processing type vapor phase growth apparatus.
Figure 2:
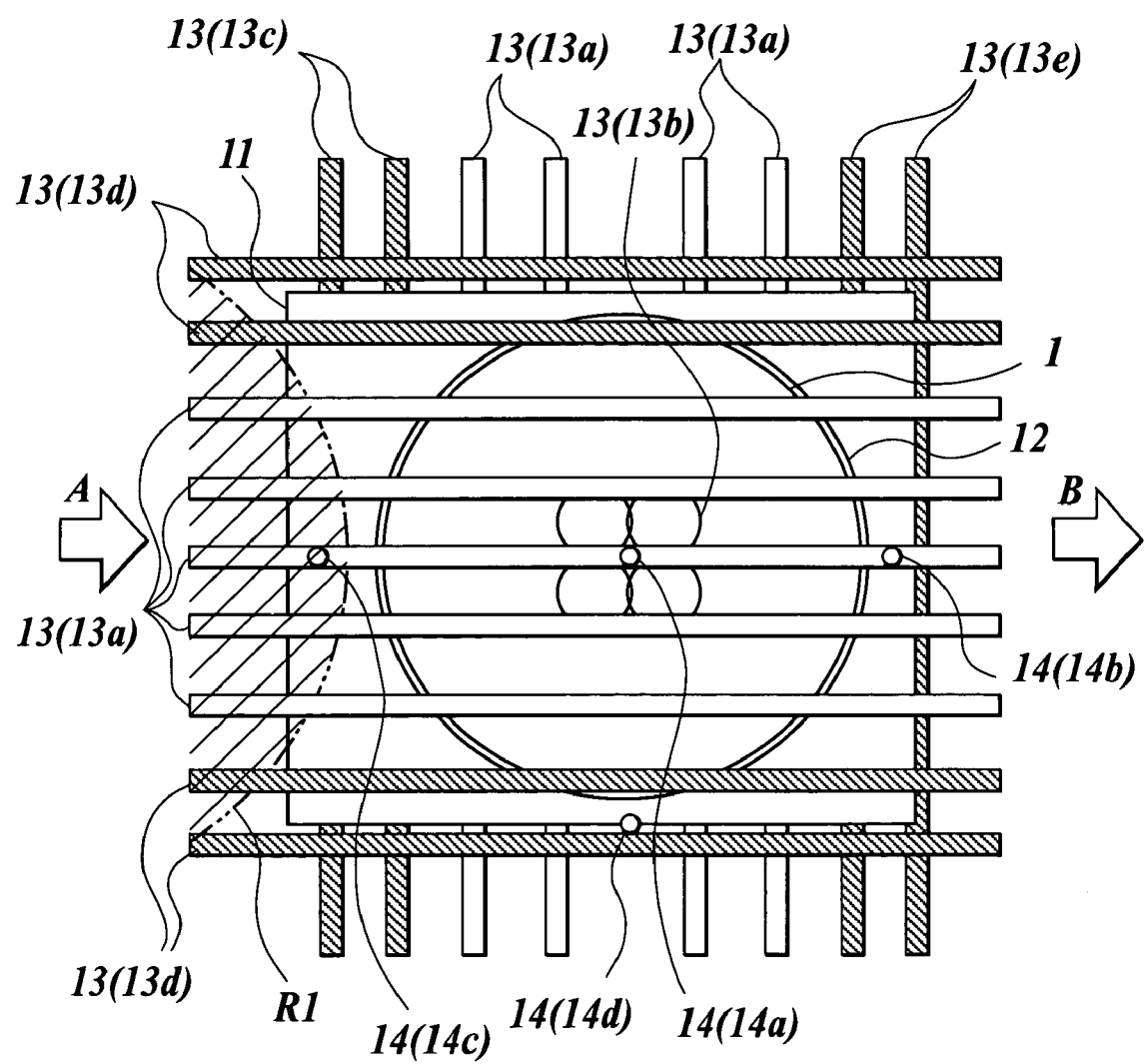
FIG. 2 is a plane view schematically showing a reaction chamber to explain a method of heating output power control according to the present invention.
Figure 8:
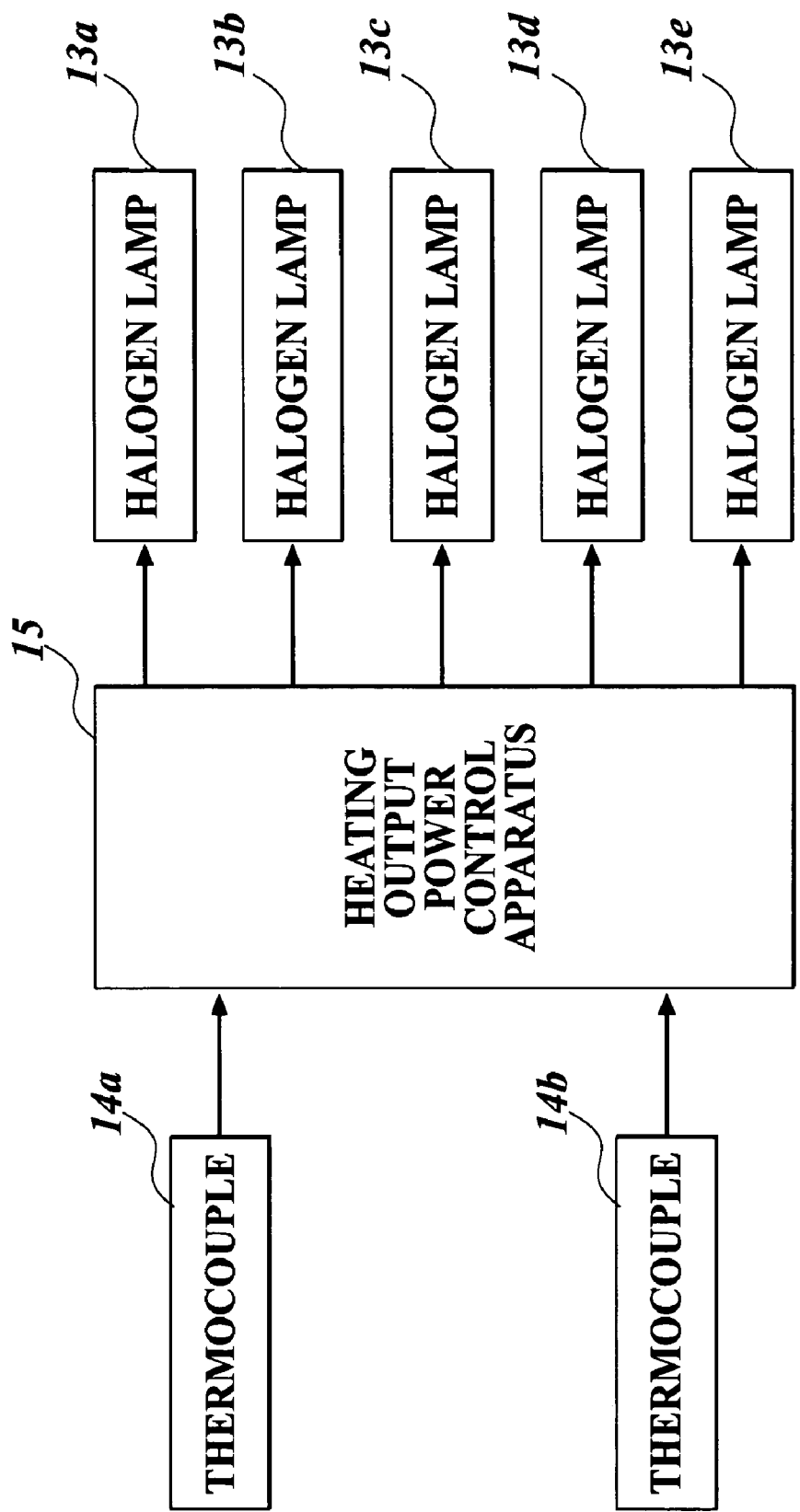
FIG. 8 is a block diagram showing a heating output power control system.

A vapor phase growth apparatus 10 shown in FIG. 1 is a single wafer processing type apparatus for growing a thin film such as a silicon epitaxial layer or the like by a vapor phase growth method on a front surface of a substrate 1 (a semiconductor single crystal substrate such as a silicon single crystal substrate or the like)(shown in FIG. 2 and the like). The apparatus 10 comprises a reaction chamber 11, a susceptor 12 arranged in the reaction chamber 11 for holding the substrate 1 on an upper surface thereof, a driving apparatus (not shown) for rotating the susceptor 12 during vapor phase growth, halogen lamps 13 (a heating apparatus) acting as a heating apparatus to heat the inside of the reaction chamber 11, a heating output power control apparatus 15 (refer to FIG. 8) for controlling heating output power of the halogen lamps 13, and thermocouples 14 (shown in FIG. 2 and the like) for detecting temperatures in the reaction chamber 11.

Gas is introduced into the reaction chamber 11, for example, along a direction of an arrow A and is exhausted along a direction of an arrow B. In short, gas flows from the left side to the right side in FIG. 1.

In this vapor phase growth apparatus 10, a thin film can be grown by a vapor phase growth method on a front surface of the substrate 1 by arranging the susceptor 12 holding the substrate 1 in the reaction chamber 11, heating the substrate 1 and the susceptor 12 in the reaction chamber 11 with the halogen lamps 13 under control of the heating output power control apparatus 15 while rotating the susceptor 12 and introducing gas into the reaction chamber 11.

For example, as shown in FIG. 2, multiple halogen lamps 13 (for example, nine lamps) are arranged on an upper side of the reaction chamber 11 along the gas flow, and other halogen lamps 13 (for example, eight lamps) are arranged on a lower side of the reaction chamber 11 perpendicularly to a direction of the gas flow. In addition, the halogen lamps 13 are also arranged at the center (corresponding to the center of the substrate 1) of the reaction chamber 11.

To distinguish the halogen lamps 13 from one another, reference numerals distinguishing as halogen lamps 13a, 13b, 13c, 13d and 13e corresponding to regions of the halogen lamps 13 respectively are arranged.

In the reaction chamber 11, thermocouples 14 are arranged in a region of the center of the substrate 1, a region placed on a gas exhaust side of the substrate 1, a region (a gas introduction region R1; a shaded area in FIG. 2) placed on a gas introduction side and a region placed on a side surface side of the reaction chamber 11, respectively. To distinguish the thermocouples 14 from one another, reference numerals distinguishing as a thermocouple 14a (a detector; particularly a second detector), thermocouple 14b (a detector; particularly a first detector), a thermocouple 14c and a thermocouple 14d are arranged.

In the vapor phase growth apparatus 10 of the present invention, heating output power levels of the halogen lamps 13a and 13b arranged near to the center of the substrate 1 are controlled according to temperature detected by the thermocouple 14a corresponding to the center of the substrate 1. A heating output power ratio of the halogen lamp 13a to the halogen lamp 13b is set to a predetermined value in advance.

Heating output power levels of the other halogen lamps 13 (shown by shading), that is, the halogen lamp 13c (the gas introduction region), the halogen lamp 13d (the side surface side of the reaction chamber 11) and the halogen lamp 13e (the gas exhaust region) are controlled according to temperature detected by the thermocouple 14b placed at the gas exhaust region. The heating output power ratio among the halogen lamps 13c, 13d and 13e is set to a predetermined value in advance in the same manner.

A method of determining the heating output power ratio among the halogen lamps 13, that is, a method of determining a ratio of amounts of heating at the regions will be described.

Initially, a substrate 1 is placed in a reaction chamber 11. Without rotating the substrate 1, within a temperature range of kinetic control (lower than a temperature of original vapor phase growth), vapor phase growth of a thin film on a front surface of the substrate 1 is performed plural times while changing balance of heating output power levels of the halogen lamps 13a, 13b, 13c, 13d and 13e. A balance of the heating output power levels of the halogen lamps 13, which provides the best thin film thickness distribution, is set as a temporary heating output power ratio. Good thin film thickness distribution within the temperature range of kinetic control means good temperature distribution. Growth rate of a thin film on a substrate 1 becomes larger as reaction temperature is heightened within a certain temperature range (for example, approximately 800° C. to 950° C. in case of a silicon single crystal thin film). The temperature range of kinetic control denotes this temperature range.

Next, a substrate 1 is placed in the reaction chamber 11, and vapor phase growth of a thin film on a front surface of the substrate 1 without rotating the substrate 1 at original temperature of the vapor phase growth (temperature range of diffusion control; for example, approximately 1100° C. when a silicon single crystal thin film is grown by using trichlorosilane gas) is performed several times while keeping the heating output power levels of the halogen lamps 13a and 13b to constant values and while equally changing the output power levels of the halogen lamps 13c, 13d, and 13e in synchronization with change of temperature setting of the halogen lamp 13e within a range of −50° C. to +50° C., for example, at a fixed heating output power ratio among the halogen lamps 13c, 13d, and 13e. And then optimal conditions for suppressing occurrence of slip dislocation as possible and making in-plane resistivity distribution in the substrate 1 become better are determined. A heating output power ratio of the halogen lamp 13a to the halogen lamp 13b (hereinafter, a first heating output power ratio; the first heating output power ratio is the same as the temporary heating output power ratio described above) and a heating output power ratio among the halogen lamps 13c, 13d and 13e (hereinafter, a second heating output power ratio) on these optimal conditions are respectively used as heating output power ratios set to the predetermined values.

Inside of the reaction chamber 11 is divided into two major regions denoting the center of substrate 1 and a periphery of the substrate 1. The halogen lamps 13a and 13b are arranged at the center of substrate 1, and the halogen lamps 13c, 13d and 13e are arranged at the periphery of the substrate 1. Heating output power levels of the halogen lamps 13c, 13d and 13e at the periphery of the substrate 1 are controlled according to the temperature detected by the thermocouple 14b arranged at the gas exhaust region, where atmosphere gas temperature is comparably stable, and by the above described second heating output power ratio. Heating output power levels of the halogen lamps 13a and 13b at the center of the substrate 1 are controlled according to a temperature detected by the thermocouple 14a arranged at the position corresponding to the center of the substrate 1 and by the first heating output power ratio.

In short, heating output power control at the gas introduction region R1 to the reaction chamber 11 is performed according to the temperature detected by the thermocouple 14b of the gas exhaust region which is arranged at a region other than the gas introduction region R1 (hereinafter, referred as a standard region).

Accordingly, because the heating can be performed while keeping the heating output power ratio of the standard region to the gas introduction region R1 to a constant level, change in temperature difference, which tends to happen often especially during heat up process, between the above-described regions can be suppressed.

Figure 3:
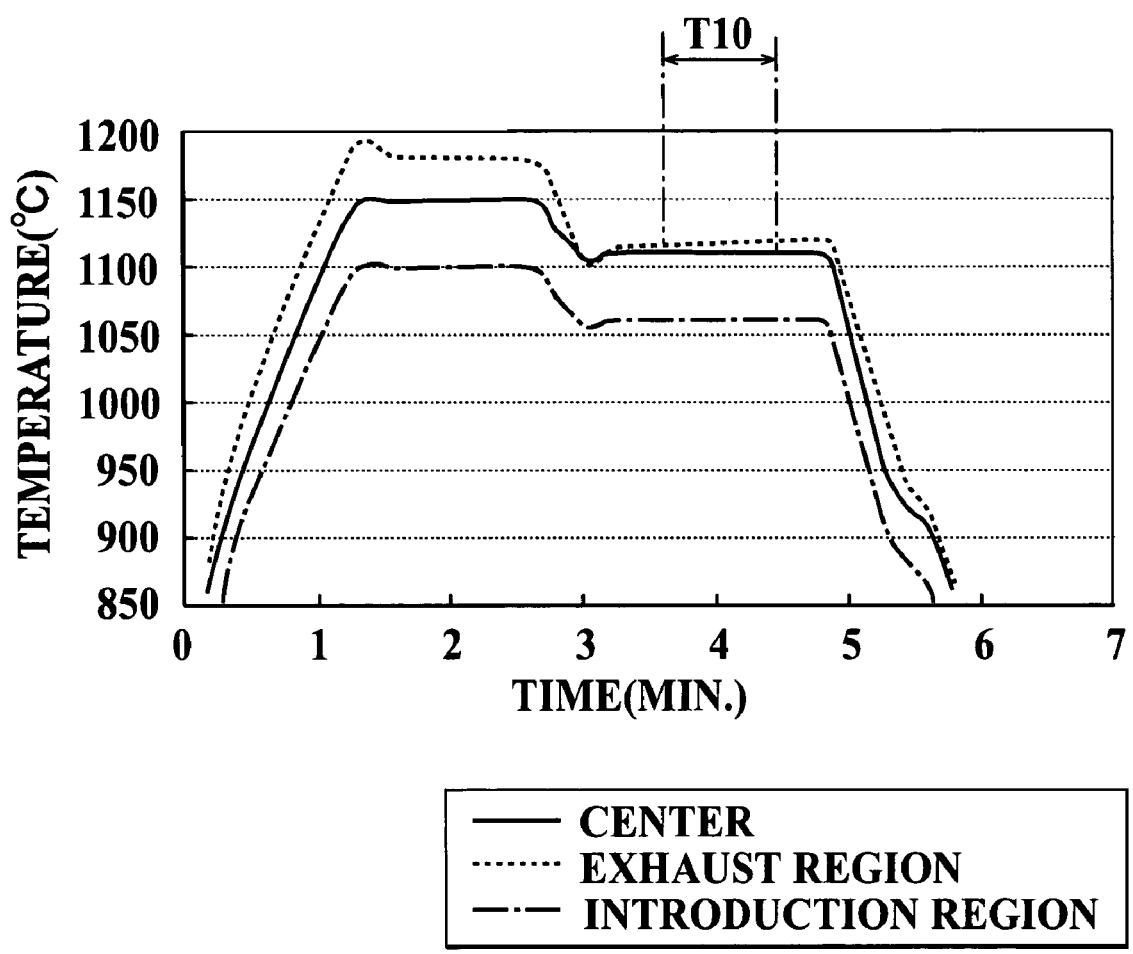
FIG. 3 is a graph showing temperature change with the passage of time at various positions (the center of a substrate, a gas introduction region and a gas exhaust region) in a reaction chamber when heating output power control is performed according to the method of the present invention.

FIG. 3 shows temperature change with the passage of time at various positions (the center of the substrate 1, the gas introduction region and the gas exhaust region) in the reaction chamber 11 when a vapor phase growth using the vapor phase growth apparatus 10 of the present invention is performed just after the heating control method being changed from the prior art control method, which controls temperatures independently by temperature setting for each position, to a control method based on the heating output power ratio according to the present invention. The heating output power ratio used for the regions in the reaction chamber 11 is a set that is used for a heat treatment of approximately 1150° C. performed before the vapor phase growth. Temperature in the "INTRODUCTION REGION" shown in FIG. 3 is equivalent to the temperature of the gas introduction region R1. A period of time T10 in FIG. 3 indicates a period of time for a vapor phase growth.

Figure 6:
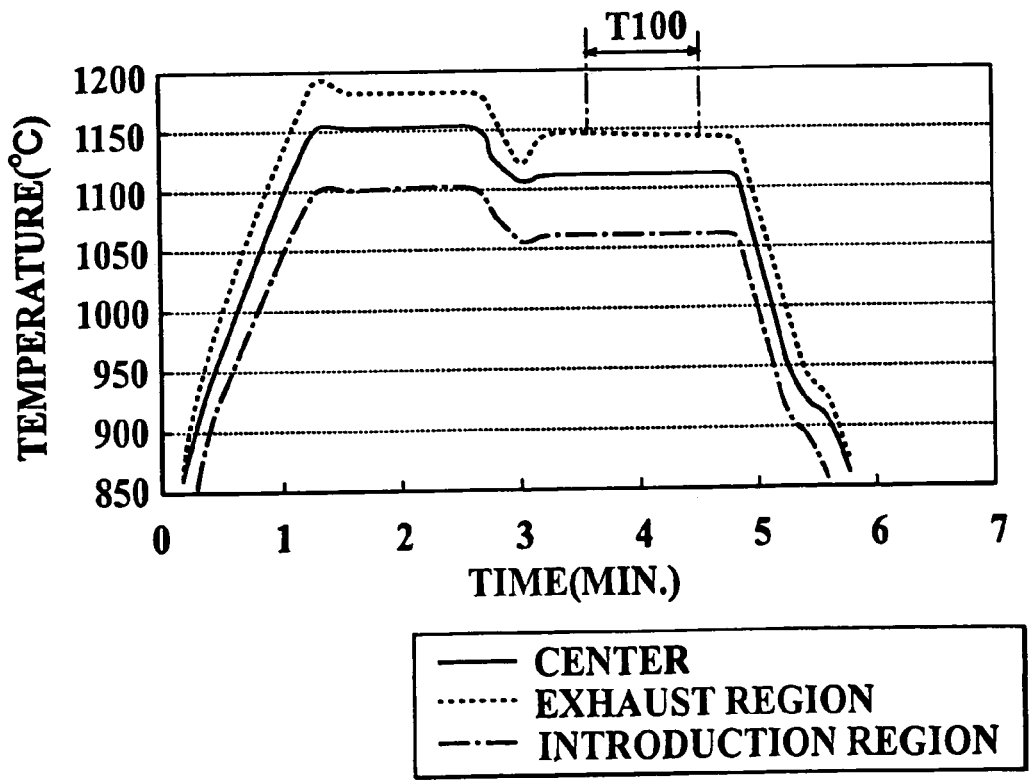
FIG. 6 is a graph showing temperature change with the passage of time at various positions (the center of a substrate, a gas introduction region and a gas exhaust region) in a reaction chamber when heating output power control is performed according to the method of the prior art.

By comparing FIG. 3 with FIG. 6, in the vapor phase growth apparatus 10 of the present invention, because heating output power for the gas introduction region R1 is low as compared with that in case of using the prior art vapor phase growth apparatus 100, temperature of the gas introduction region R1 during vapor phase growth can approach to temperature of the center of the substrate 1 (in FIG. 6, a period of time for vapor phase growth is indicated by a period of time T100). That is, temperature distribution in the substrate 1 can be lessened.

Figure 4:
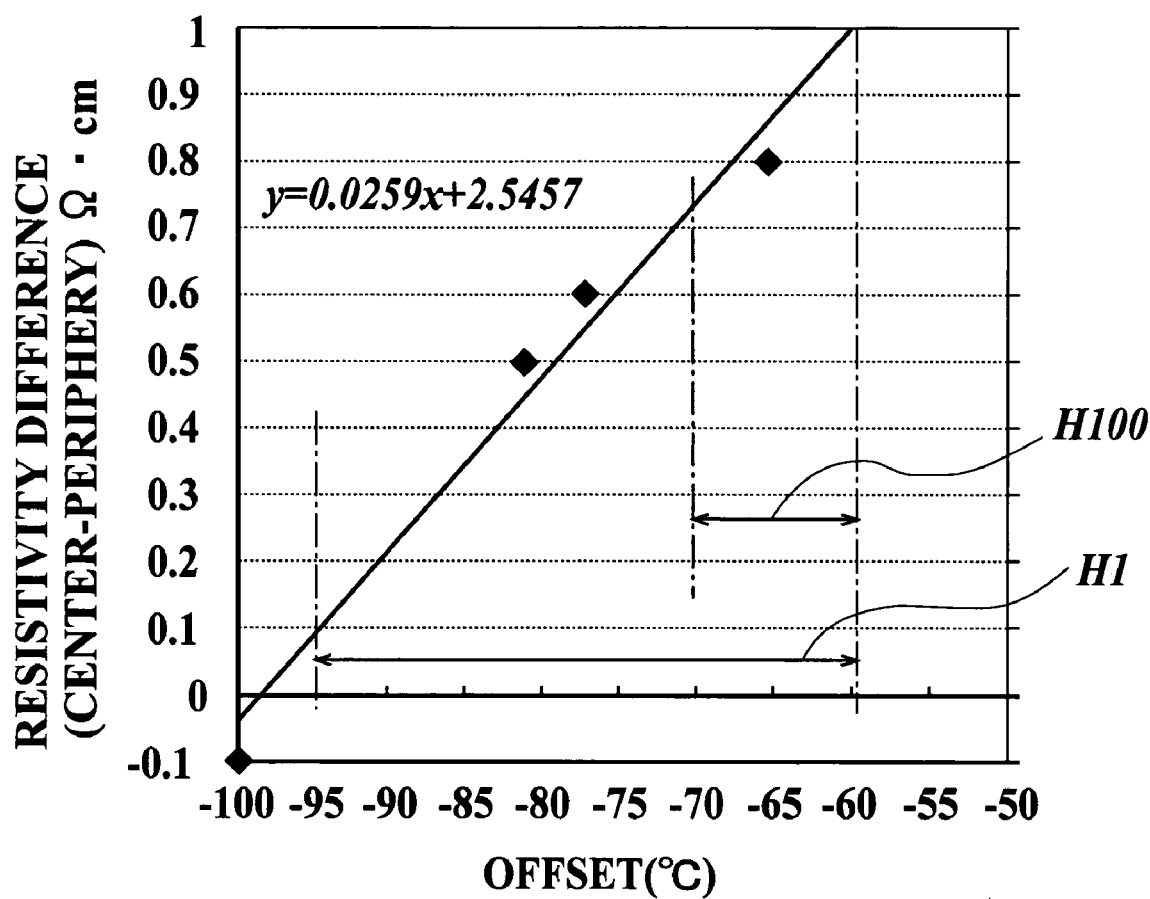
FIG. 4 is a graph showing a correlation between offset levels (X-axis) and resistivity distribution of a thin film (Y-axis; resistivity difference between the center of the substrate and periphery of the substrate)
Figure 5:
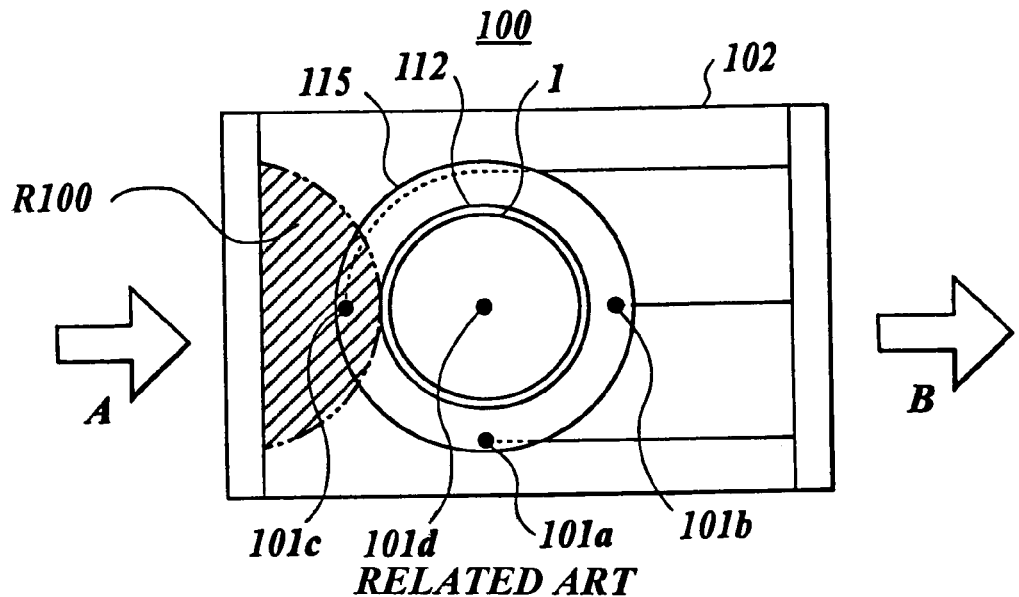
FIG. 5 is a plane view schematically showing a reaction chamber to explain a method of controlling temperature in a prior art.

FIG. 4 is a graph showing a correlation between the offset level (X-axis) and the resistivity distribution (Y-axis; resistivity difference between the center of the substrate 1 and the periphery of the substrate 1).

After a heating output power ratio for each halogen lamp is decided according to the above-described procedure, this graph is obtained, by using the vapor phase growth apparatus 10 of the present invention, by changing heating output power levels at the gas introduction region, the side surface region of the reaction chamber 11 and the gas exhaust region against the center of the substrate 1, and growing a silicon single crystal thin film with a thickness of approximately 7 μm and a resistivity of approximately 10 Ω·cm at 1110° C. by a vapor phase growth method on a front surface of a $p^+$-type silicon single crystal substrate to which boron is added at high concentration. Change of the heating output power levels at the gas introduction region, the side surface region of the reaction chamber 11 and the gas exhaust region are performed together by changing temperature setting of the gas exhaust region while keeping the heating output power ratio for each other.

The X-axis indicates differences between temperature settings of heating for the center of the substrate 1 and temperature settings of heating for the gas exhaust region. Temperature at the center the center of the substrate 1 is detected by the thermocouple 14a, and temperature of the gas exhaust region is detected by the thermocouple 14b.

In FIG. 4, H1 indicates a range of an offset level (offset of temperature setting of the gas exhaust region against the center of the substrate 1) where no slip dislocation occurs in case of the vapor phase growth by the conditions described above.

As realized by the range H1, when the offset level is within a range of −60° C. to −95° C., slip dislocation scarcely occurs.

Accordingly, when a vapor phase growth is performed by using the vapor phase growth apparatus 10, slip dislocation scarcely occurs because the offset level can be maintained within the range H1 even though in-plane resistivity distribution is substantially made to 0 (zero) by setting the offset to −95° C., that is, temperature setting of the gas exhaust region is set to be lower than setting temperature of the center of the substrate 1 by −95° C. As described above, temperature of the gas exhaust region against the center of the semiconductor single crystal substrate 1 is controlled so as to minimize resistivity distribution of the semiconductor single crystal thin film within a range of no occurrence of slip dislocation.

As described above, in this embodiment, resistivity difference between the center and the periphery of the substrate 1 can be substantially made to zero by adjusting the temperature offset within a condition where occurrence of slip dislocation can be suppressed (in the prior art, the resistivity difference can be reduced only to 0.7Ω·cm).

Further, because heating output power in the reaction chamber 11 is controlled according to the temperatures detected at two points, that is, the position corresponding to the center of the substrate 1 in the reaction chamber 11 and the gas exhaust region in the reaction chamber 11, heating output power control can become easier as compared with control performed according to temperatures detected in three points or more (for example four points).

Figure 7:
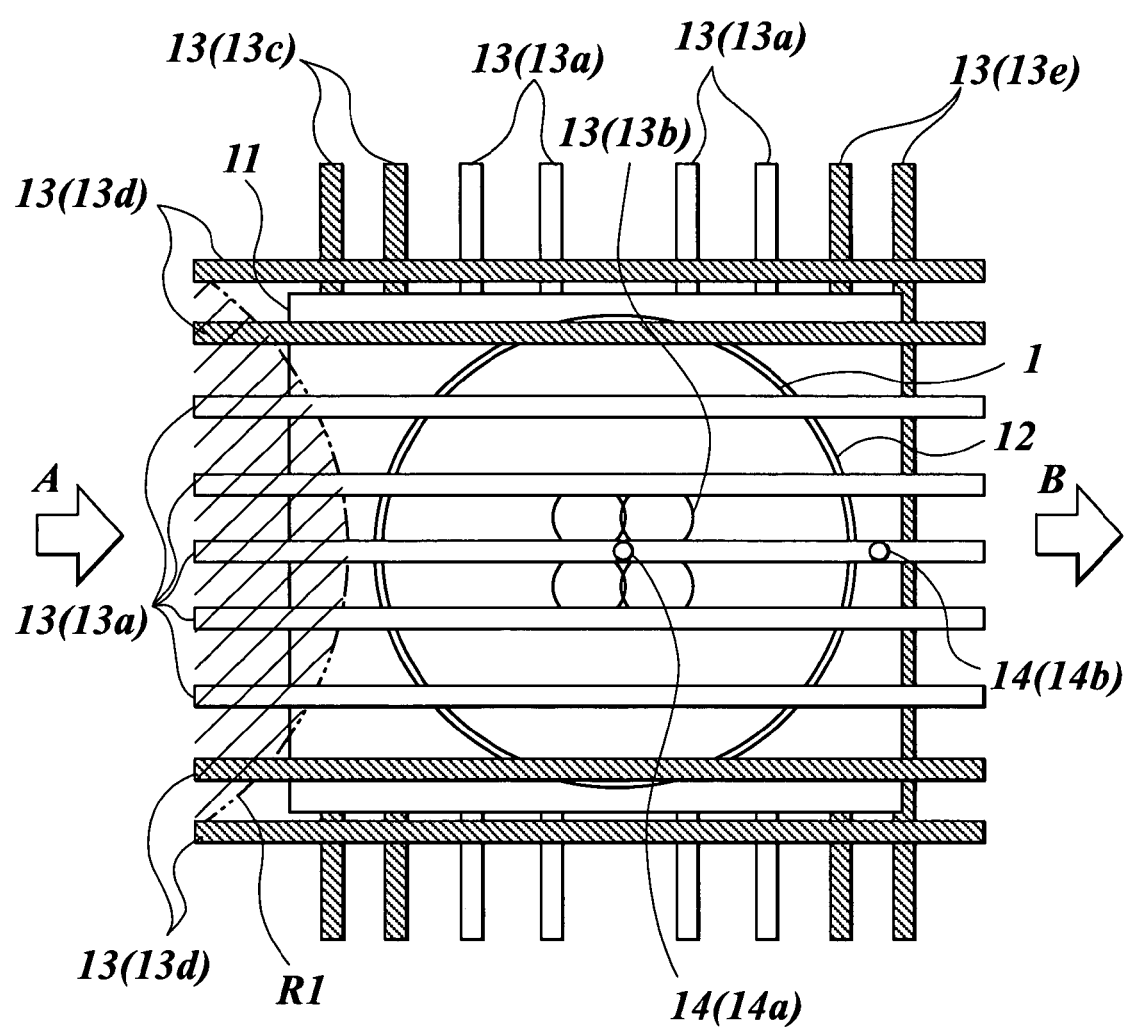
FIG. 7 is a plane view schematically showing the reaction chamber to explain a further appropriate method of heating output power control according to the present invention.

In the above-described embodiment, an example that the vapor phase growth apparatus 10 is provided with the thermocouple 14c of the gas introduction region in the reaction chamber 11 and the thermocouple 14d of the side surface side in the reaction chamber 11 is explained. However, both of the thermocouples 14c and 14d are not required for heating output power control in the reaction chamber 11. Accordingly, as shown in FIG. 7 as an example, further preferably, these thermocouples 14c and 14d are omitted, and it can be limited to only two thermocouples, the thermocouple 14b of the gas exhaust region (the first detector) and the thermocouple 14a (the second detector) of the position corresponding to the center of the substrate 1. The example shown in FIG. 7 differs from that shown in FIG. 2 only in that the thermocouples 14c and 14d are omitted. Therefore, the same reference numerals as those shown in FIG. 2 are added to the constituent elements shown in FIG. 7 which are the same as those shown in FIG. 2, and description of those constituent elements is omitted.

In case of the example shown in FIG. 7, because only two thermocouples 14a and 14b are sufficient for thermocouples (detectors), cost of configuring the vapor phase growth apparatus 10 can be reduced as compared with that requires three thermocouples or more, and maintenance cost of the vapor phase growth apparatus 10 can be considerably reduced. That is, because the detectors such as the thermocouples and the like are expendable supplies, the detector(s) are required to be changed to new one(s) many times. Therefore, maintenance cost of the vapor phase growth apparatus 10 provided with only two thermocouples can be reduced as compared with that provided with three thermocouples or more (for example, maintenance cost is half of that provided with four thermocouples, and a down time of the vapor phase growth apparatus 10 required for change of the thermocouple(s) to new one(s) is shortened (for example, a period of time is 30% of that in case of four thermocouples)).

Further, because characteristics of thermocouples differ from one another, temperature correction is required each time one thermocouple is changed to a new one. A time period required for the temperature correction becomes shortened as the number of thermocouples is decreased. Further, when a vapor phase growth condition is changed and determined (referred as "determination of condition"), a time period required for the determination of condition can be shortened as the number of detected temperatures to be considered is decreased. That is, in case of two thermocouples, because a time period required for the temperature profiling and a time period required for the determination of condition are shortened as compared with those in case of three thermocouples, productivity can be improved.

In this embodiment, as an example, heating output power control for the periphery of the substrate 1 such as the gas introduction region in the reaction chamber 11 and the like is performed according to the temperature detected by the thermocouple 14b of the gas exhaust region in the reaction chamber 11. However, a position for detecting temperature can be another region in the reaction chamber 11 if the region is not the gas introduction region R1 (for example, a position corresponding to the center of the substrate 1).

Further, arrangement of the halogen lamps 13 as the heating apparatus is an example, and another type of arrangement is applicable. Moreover, division of the regions is not limited to this embodiment, and another type of division is applicable.

Further more, each detected temperature denotes temperature detected by a thermocouple and differs from actual temperature on the substrate 1. Therefore, value used in this specification is only an aim.

As described above, in the embodiment of the present invention, in the vapor phase growth method for growing a single crystal thin film by a vapor phase growth method on the front surface of the semiconductor single crystal substrate 1, while introducing gas into the reaction chamber 11, heating output power control in the gas introduction region R1 is performed according to a temperature detected in a region other than the gas introduction region R1 in the reaction chamber 11. More specifically, heating output power control in the gas introduction region R1 is performed according to temperature, for example, detected at the gas exhaust region or a position corresponding to the center of the semiconductor single crystal substrate 1.

INDUSTRIAL APPLICABILITY

In the vapor phase growth method and apparatus according to the present invention, because heating output power control at a gas introduction region is performed according to a temperature detected at a standard region other than the gas introduction region in a reaction chamber, the heating can be performed while keeping a heating output power ratio of the standard region to the gas introduction region to a constant level. As a result, resistivity distribution can be reduced as compared with the prior art while suppressing occurrence of slip dislocation. Accordingly, the vapor phase growth method and apparatus according to the present invention is especially appropriate to a case of vapor phase growth performed while using a single wafer processing type vapor phase growth apparatus.

The invention claimed is:

1. A vapor phase growth method for growing a semiconductor single crystal thin film on a front surface of a semiconductor single crystal substrate while introducing gas into a reaction chamber, the vapor phase growth method comprising:
   giving an offset value to a first setting temperature for controlling a heat output in a gas introduction region and to a second setting temperature in a reference region other than the gas introduction region;
   detecting at least one temperature in the reference region; and
   controlling the heat output in the gas introduction region and the reference region in accordance with the detected at least one temperature.

2. The vapor phase growth method as claimed in claim 1, wherein the heating output power control in the gas introduction region is performed according to a temperature detected at a gas exhaust region in the reaction chamber.

3. The vapor phase growth method as claimed in claim 1, wherein the heating output power control in the gas introduction region is performed according to a temperature detected at a position corresponding to a center of the semiconductor single crystal substrate in the reaction chamber.

4. The vapor phase growth method as claimed in claim 1, wherein the at least one temperature comprises first and second temperatures, and the heating output power control in the reaction chamber is performed according to the first temperature detected at a position corresponding to a center of the semiconductor single crystal substrate in the reaction chamber and the second temperature detected at a gas exhaust region in the reaction chamber.

5. The vapor phase growth method as claimed in claim 2, wherein a temperature setting of the gas exhaust region against the center of the semiconductor single crystal substrate is set so as to minimize resistivity distribution of the semiconductor single crystal substrate within a range corresponding to no occurrence of slip dislocation.

6. The vapor phase growth method as claimed in claim 1, wherein the heating output power control is performed according to the at least one temperature detected by at least one thermocouple.

7. The vapor phase growth method as claimed in claim 6, wherein the at least one temperature comprises at least two temperatures, the at least one thermocouple comprises at least two thermocouples, and each of the at least two temperature is detected by respective one of the at least two thermocouples.

* * * * *